(12) United States Patent
Shi

(10) Patent No.: US 10,910,343 B2
(45) Date of Patent: Feb. 2, 2021

(54) PACKAGE STRUCTURE WITH IMPROVEMENT LAYER AND FABRICATION METHOD THEREOF

(71) Applicant: TONGFU MICROELECTRONICS CO., LTD., Nantong (CN)

(72) Inventor: Lei Shi, Nantong (CN)

(73) Assignee: TONGFU MICROELECTRONICS CO., LTD., Nantong (CN)

( * ) Notice: Subject to any disclaimer, the term of this patent is extended or adjusted under 35 U.S.C. 154(b) by 0 days.

(21) Appl. No.: 16/393,759

(22) Filed: Apr. 24, 2019

(65) Prior Publication Data
US 2020/0027859 A1    Jan. 23, 2020

(30) Foreign Application Priority Data

Jul. 19, 2018 (CN) .......................... 2018 1 0796944

(51) Int. Cl.
*H01L 23/00* (2006.01)
*H01L 21/56* (2006.01)
*H01L 21/78* (2006.01)

(52) U.S. Cl.
CPC ............ *H01L 24/96* (2013.01); *H01L 21/561* (2013.01); *H01L 21/565* (2013.01); *H01L 21/568* (2013.01); *H01L 21/78* (2013.01); *H01L 23/562* (2013.01); *H01L 24/05* (2013.01); *H01L 24/13* (2013.01); *H01L 2224/024* (2013.01); *H01L 2224/0239* (2013.01); *H01L 2224/13024* (2013.01); *H01L 2224/13111* (2013.01); *H01L 2224/13139* (2013.01); *H01L 2224/13144* (2013.01); *H01L 2224/13147* (2013.01); *H01L 2224/95001* (2013.01); *H01L 2924/014* (2013.01); *H01L 2924/0105* (2013.01); *H01L 2924/01013* (2013.01); *H01L 2924/01028* (2013.01); *H01L 2924/01029* (2013.01); *H01L 2924/01047* (2013.01); *H01L 2924/01079* (2013.01); *H01L 2924/067* (2013.01); *H01L 2924/0695* (2013.01); *H01L 2924/07025* (2013.01); *H01L 2924/3511* (2013.01)

(58) Field of Classification Search
CPC ...................................................... H01L 24/96
USPC ....................................................... 257/738
See application file for complete search history.

(56) References Cited

U.S. PATENT DOCUMENTS

| | | | | |
|---|---|---|---|---|
| 9,209,117 | B2 * | 12/2015 | Wang | H01L 23/49582 |
| 2001/0052647 | A1 * | 12/2001 | Plepys | H01L 21/50 257/738 |
| 2007/0052071 | A1 * | 3/2007 | Kobayashi | H01L 25/105 257/666 |
| 2009/0057701 | A1 * | 3/2009 | Chao | H01L 33/508 257/98 |
| 2011/0006322 | A1 * | 1/2011 | Li | H01L 21/76898 257/98 |

(Continued)

*Primary Examiner* — Jami Valentine Miller
(74) *Attorney, Agent, or Firm* — Anova Law Group, PLLC

(57) ABSTRACT

The present disclosure provides a package structure and its packaging method. The packaging method includes: providing a bonding layer on a substrate; forming an improvement layer on the bonding layer, where the improvement layer has openings, and bottoms of the openings expose a surface of the bonding layer; providing chips, each including a non-functional surface; and mounting the chips by attaching the non-functional surface to the bonding layer at the bottoms of the openings.

19 Claims, 3 Drawing Sheets

(56) References Cited

U.S. PATENT DOCUMENTS

| | | | | |
|---|---|---|---|---|
| 2013/0065017 A1* | 3/2013 | Sieber | ............... | B41J 2/14129 |
| | | | | 428/137 |
| 2013/0256884 A1* | 10/2013 | Meyer | ............... | H01L 23/5389 |
| | | | | 257/738 |
| 2014/0252641 A1* | 9/2014 | Lim | ............... | H01L 23/5389 |
| | | | | 257/773 |
| 2017/0077022 A1* | 3/2017 | Scanlan | ............... | H01L 22/14 |

\* cited by examiner

PACKAGE STRUCTURE WITH IMPROVEMENT LAYER AND FABRICATION METHOD THEREOF

CROSS-REFERENCES TO RELATED APPLICATIONS

This application claims the priority of Chinese Patent Application No. 201810796944.2, filed on Jul. 19, 2018, the content of which is incorporated herein by reference in its entirety.

TECHNICAL FIELD

The present disclosure generally relates to the field of packaging and more particularly, relates to a chip package structure and its fabrication method.

BACKGROUND

With rapid development of the integrated circuit manufacturing industry, requirements for packaging technologies of integrated circuits are increasing. Conventional packaging technologies include ball grid array package (BGA), chip scale package (CSP), wafer-level package (WLP), three-dimensional (3D) package and system-in-package (SiP). Wafer-level package is gradually adopted by most semiconductor manufacturers due to its excellent advantages. All or most of its processes are completed on a silicon wafer that previous processes have completed, and finally the silicon wafer is directly diced into separate devices. The wafer-level package has the following advantages. The packaging efficiency is high and multiple wafers may be processed simultaneously; the wafer-level package has the advantages of flip-chip package such as light, thin, short, and small; compared with previous processes, only two processes of lead redistribution layer (RDL) and bump fabrication are added, and the rest are conventional processes; and multiple tests in the conventional packaging are reduced. Therefore, the world's major integrated circuit (IC) packaging companies have invested in the research, development and production of the wafer-level package.

However, the conventional wafer-level packaging technologies still have many problems, which may have poor package structure performance.

SUMMARY

One aspect of the present disclosure includes a method for fabricating a package structure. The method includes: providing a bonding layer on a substrate; forming an improvement layer on the bonding layer, where the improvement layer has openings, and bottoms of the openings expose a surface of the bonding layer; providing chips, each including a non-functional surface; and mounting the chips by attaching the non-functional surfaces to the bonding layer at the bottoms of the openings.

Optionally, each chip may include a functional surface opposing to the non-functional surface; the functional surface of the chip may be equal to or lower than the top surface of the improvement layer; or the functional surface of the chip may be higher than the top surface of the improvement layer.

Optionally, the bonding layer may include an ultraviolet adhesive, an acrylic acid pressure sensitive adhesive or an epoxy resin pressure sensitive adhesive.

Optionally, forming the improvement layer and the openings may include forming an improvement film on the surface of the bonding layer, and exposing and developing the improvement film to form the improvement layer having the openings.

Optionally, a material of the improvement film may include a photoresist.

Optionally, after mounting the chips, it may further include forming an encapsulation layer on the top surface of the improvement layer, sidewalls of the chips and the functional surfaces; performing a thinning process on the encapsulation layer till the functional surfaces are exposed; forming a distribution layer on the functional surfaces and a passivation layer on the distribution layer, where the passivation layer has solder openings exposing a top of the distribution layer; forming solder balls in the solder openings; after forming the solder balls, removing the bonding layer and the substrate to expose the non-functional surfaces of the chips and the improvement layer; and after removing the bonding layer and the substrate, performing a dicing process to form a plurality of chip structures.

Optionally, the chip structures may not include the improvement layer; or the chip structures may include a portion of the improvement layer.

Optionally, after removing the bonding layer and before performing the dicing process, it may further include the improvement layer removal.

Another aspect of the present disclosure includes a package structure. The package structure includes: a bonding layer on a substrate; an improvement layer on the bonding layer, where the improvement layer has openings, and bottoms of the openings expose a surface of the bonding layer; and chips in the openings, where chips include non-functional surfaces attached to the bonding layer at the bottoms of the openings.

Optionally, the bonding layer may include an ultraviolet adhesive, an acrylic acid pressure sensitive adhesive or an epoxy resin pressure sensitive adhesive; and a material of the improvement film may include a photoresist.

Optionally, each chip may include a functional surface opposing to the non-functional surface; the functional surface of the chip may be equal to or lower than the top surface of the improvement layer; or the functional surface of the chip may be higher than the top surface of the improvement layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

The present disclosure provides a package structure and its packaging method. The packaging method includes: providing a bonding layer on a substrate; forming an improvement layer on the bonding layer, where the improvement layer has openings, and bottoms of the openings expose a surface of the bonding layer; providing chips, each including a non-functional surface; and mounting the chips by attaching the non-functional surface to the bonding layer at the bottoms of the openings.

Figure 1:
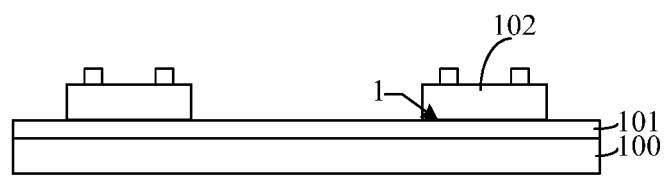
FIG. 1 illustrates a structural schematic of an exemplary package structure of the present disclosure.

FIG. 1 illustrates a structural schematic of an exemplary package structure.

Referring to FIG. 1, a substrate 100 may be provided and a surface of the substrate 100 may have a bonding layer 101. Chips 102 may be provided and each chip 102 may include a non-functional surface 1. The chips 102 may be mounted by attaching the non-functional surfaces 1 to the bonding layer 101.

In the above-mentioned method, the chips 102 may be made of a material including silicon. Silicon may have a relatively small thermal expansion coefficient, while the thermal expansion coefficient of the material of the bonding layer 101 may be much larger than the thermal expansion coefficient of the chips 102. Therefore, the degree of thermal expansion of the bonding layer 101 and the chips 102 may be different during a subsequent high-temperature process, and the chips 102 may be easily offset with respect to the bonding layer 101, which may be disadvantageous for improving the package structure performance.

In order to solve the technical solution, the present disclosure may provide a fabrication method for the package structure by forming an improvement layer on the top of the bonding layer. The improvement layer may have openings therein which may limit the positions of the chips and make the relative displacement of the chips less likely to occur, so it may be advantageous for improving the package structure performance.

FIGS. 2-13 illustrate structural schematics corresponding to certain stages of an exemplary fabrication method of a package structure according to various disclosed embodiments of the present disclosure.

Figure 2:
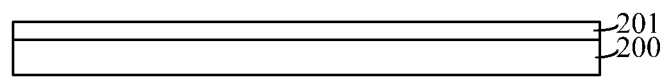
FIGS. 2-13 illustrate structural schematics corresponding to certain stages of a fabrication method of an exemplary package structure according to various disclosed embodiments of the present disclosure.

Referring to FIG. 2, a substrate 200 may be provided and a surface of the substrate 200 may have a bonding layer 201.

The substrate 200 may be made of a material including glass, a ceramic, a metal, a polymer, or any other suitable material(s).

The shape of the substrate may include a circle, a rectangle, a triangle, or any other suitable shape(s).

The bonding layer 201 may be used to subsequently bond the chips to the substrate 200.

In one embodiment, the material of the bonding layer 201 may be an ultraviolet adhesive. The ultraviolet adhesive may be highly viscous without ultraviolet light exposure. However, the cross-linking chemical bond in the ultraviolet adhesive after being exposed to ultraviolet light may be broken to cause the viscosity to be greatly reduced or lost, which may be advantageous for subsequent peeling of the bonding layer 201 and the substrate 200.

In some embodiments, the bonding layer 201 may include an acrylic acid pressure sensitive adhesive or an epoxy resin pressure sensitive adhesive.

The bonding layer 201 may be formed by a process including a spin-coating process, a spray-coating process, a rolling process, a printing process, a non-spin-coating process, a hot-pressing process, a vacuum-pressing process or a pressure-pressing process.

The material of the bonding layer 201 may have a first thermal expansion coefficient which may be relatively high.

Figure 3:
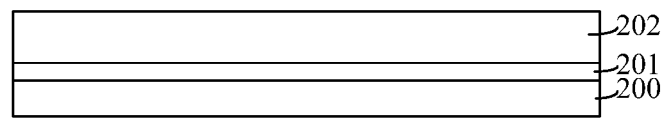

Referring to FIG. 3, an improvement film 202 may be formed on the surface of the bonding layer 201.

The improvement film 202 may be made of a material including a photoresist. The improvement film 202 may be formed by a process including a spin-coating process or a printing process.

The improvement film 202 may be used to subsequently form an improvement layer. The improvement film 202 may have a second thermal expansion coefficient, and the difference between the second thermal expansion coefficient and the first thermal expansion coefficient may fall within a preset range, which may be about −50 to 50. Therefore, in a subsequent high-temperature process, the relative displacement between the improvement layer and the bonding layer 201 may be less likely to occur, and the openings in the subsequent improvement layer may be used to limit the displacement of the chips, which may be advantageous for reducing offset or warpage of the package structure.

In one embodiment, the thickness of the improvement film 202 may be equal to the height of subsequent chips.

In other embodiments, the thickness of the improvement film 202 may be less than or greater than the thickness of the chips.

Figure 4:
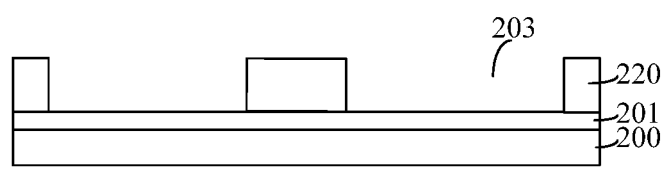

Referring to FIG. 4, the improvement film 202 (shown in FIG. 3) may be exposed and developed to form an improvement layer 220. The improvement layer 220 may have openings 203 and bottoms of the openings 203 may expose the surface of the bonding layer 201.

The improvement layer 220 may be formed from the improvement film 202. The difference between the second thermal expansion coefficient and the first thermal expansion coefficient may fall within a preset range. Therefore, in the subsequent high-temperature process, the relative displacement between the improvement layer 220 and the bonding layer 201 may be less likely to occur.

Moreover, the openings 203 may be used to limit the positions of the subsequent chips, so the chips may be less likely to be offset. The relative displacement between the chips, the improvement layer 220 and the bonding layer 201 may be less likely to occur, which may be advantageous for reducing offset or warpage of the package structure.

Figure 5:
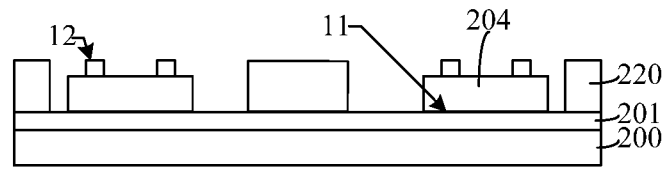

Referring to FIG. 5, chips 204 may be provided, and each chip 204 may include a functional surface 12 and a non-functional surface 11. The chips 204 may be mounted by attaching the non-functional surfaces 11 to the bonding layer 201 at the bottoms of the openings 203.

The chips 204 may be made of a material including silicon. The thermal expansion coefficient of the chips 204 may be about 2.2 to 2.4. The functional surfaces 12 may have soldering pads (not shown). The soldering pads may be used to output electrical signals in the chips 204.

The thickness of the chips 204 may be about 20 micrometers to about 100 micrometers.

The chips 204 may be mounted on the substrate 200 through the bonding layer 201. The chips 204 may be in the openings 203. The improvement layer 220 of the sidewalls of the openings 203 may be used to limit the positions of the chips 204, preventing the relative displacement between the chips 204 and the improvement layer 220 or the bonding layer 201, which may be advantageous for reducing offset or warpage of the package structure.

Figure 6:
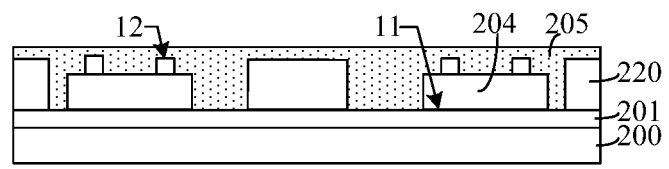

Referring to FIG. 6, an encapsulation layer 205 may be formed on the improvement layer 220, the sidewalls of the chips 204 and the functional surfaces 12.

In one embodiment, the encapsulation layer 205 may be made of a material including epoxy resin. The epoxy resin may have a good sealing performance and form encapsulation easily, which may a better material for forming the encapsulation layer 205.

In other embodiments, the encapsulation layer may be made of an encapsulating material including polyimide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate copolymer, and polyvinyl alcohol.

In one embodiment, the encapsulation layer 205 may be formed by an injection molding process. In other embodiments, the encapsulation layer may be formed by a transfer molding process.

The method for forming the encapsulation layer 205 using the injection molding process may include providing a mold, filling the mold with the encapsulating material which may encapsulate the chips 204, and heating and solidifying the encapsulating material to form the encapsulation layer 205.

The encapsulation layer 205 may protect the chips 204 and also be used as a carrier for the subsequent processes.

In the process of forming the encapsulation layer 205, the difference between the thermal expansion coefficient of the material of the chips 204 and the thermal expansion coefficient of the improvement layer 220 and the bonding layer 201 may be relatively large, but the chips 204 may be in the openings 203, and the openings 203 may be used to limit the relative displacement between the chips 204 and each of the improvement layer 220 and the bonding layer 201 during the heating and solidifying process.

Moreover, the difference between the thermal expansion coefficient of the improvement layer 220 and the thermal expansion coefficient of the bonding layer 201 may fall within a preset range. Therefore, in the heating and solidifying process, the relative displacement between the improvement layer 220 and the bonding layer 201 may be less likely to occur. The relative displacement between the chips 204, the improvement layer 220 and the bonding layer 201 may be less likely to occur, which may be advantageous for reducing offset or warpage of the package structure.

Figure 7:
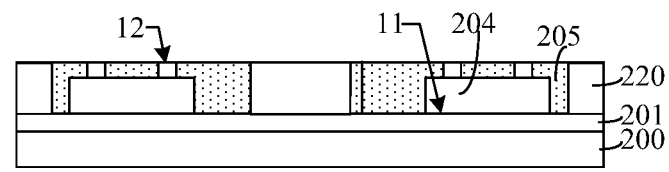

Referring to FIG. 7, a thinning process may be performed on the encapsulation layer 205 till the functional surfaces 12 may be exposed.

The thinning process may be performed on the encapsulation layer 205 to expose the functional surfaces 12, which may be advantageous for electrically connecting a subsequent formed distribution layer to the chips 204.

Figure 8:
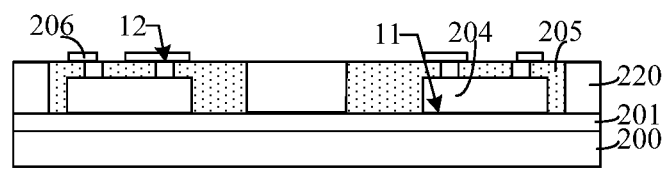

Referring to FIG. 8, after the thinning process performed on the encapsulation layer 205, a distribution layer 206 may be formed on the functional surfaces 12.

The distribution layer 206 may be made of a metal including aluminum, copper, tin, nickel, gold, silver, or any other suitable metal(s).

The distribution layer 206 may be formed by a process including an evaporation process, a sputtering process, an electroplating process or an electroless plating.

The bottom of the distribution layer 206 may be electrically connected to the top of the chips 204, and the top of the distribution layer 206 may be electrically connected to subsequent solder balls.

Figure 9:
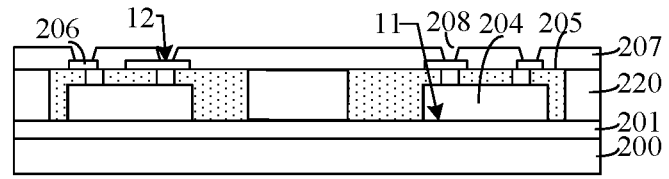

Referring to FIG. 9, a passivation layer 207 may be formed on the improvement layer 220 and the sidewalls of the distribution layer 206. The passivation layer 207 may have solder openings 208 exposing the top of the distribution layer 206.

The passivation layer 207 may be made of a material including polyimide, polyparaphenylene benzobisoxazole or photosensitive benzocyclobutene. The passivation layer 207 may be formed by a process including a spin-coating process or a printing process.

The passivation layer 207 may expose the distribution layer 206, which may be advantageous for electrically connecting subsequent solder balls to the distribution layer 206.

The solder openings 208 may be used to accommodate solder balls subsequently.

Figure 10:
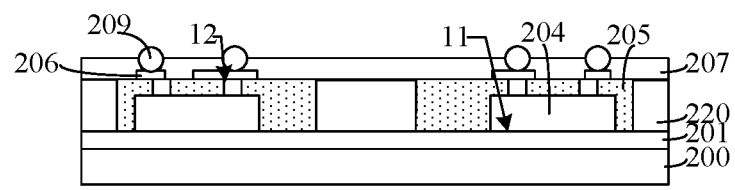

Referring to FIG. 10, solder balls 209 may be formed in the solder openings 208.

The solder balls 209 may include gold tin solder balls, silver tin solder balls or copper tin solder balls.

In one embodiment, the solder balls 209 may be gold tin solder balls. The process for forming the gold tin solder balls may include: forming a gold tin layer in the solder openings 208; after forming the gold tin layer, performing a high-temperature reflow process to reflow the gold tin layer into spherical shapes; and forming gold tin solder balls after the temperature is cooled.

Figure 11:
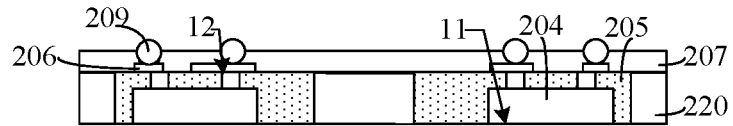

Referring to FIG. 11, after forming the solder balls 209, the bonding layer 201 (shown in FIG. 10) and the substrate 200 (shown in FIG. 10) may be removed.

In one embodiment, the material of the bonding layer 201 may be an ultraviolet adhesive. The method for removing the substrate 200 (shown in FIG. 10) and the bonding layer 201 (shown in FIG. 10) may include reducing the adhesiveness of the bonding layer 201 by exposing to ultraviolet light which may enable the bonding layer 201 and the substrate 200 to be peeled off.

Figure 12:
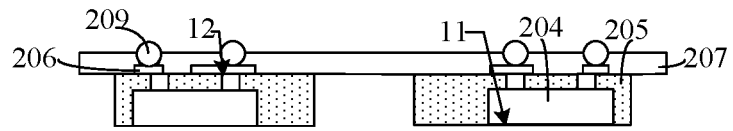

Referring to FIG. 12, after removing the bonding layer 201 and the substrate 200, the improvement layer 220 may be removed.

The improvement layer 220 may be removed by a process including one or a combination of a dry etching process and a wet etching process.

Figure 13:
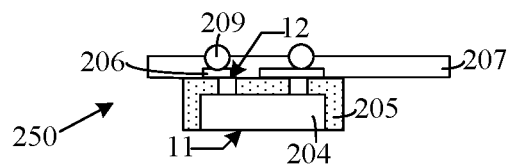

Referring to FIG. 13, after removing the improvement layer 220, a dicing process may be performed to form a chip structure 250.

After removing the improvement layer 220, only the passivation layer 207 may be between the adjacent chips 204, so only the passivation layer 207 may be cut by the dicing process.

Figure 14:
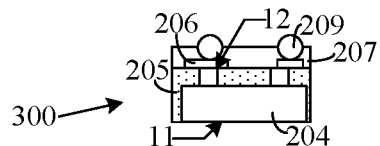
FIG. 14 illustrates a structural schematic of another exemplary package structure of the present disclosure.

FIG. 14 illustrates a structural schematic of another exemplary package structure of the present disclosure.

Referring to FIG. 14, after removing the substrate 200 and the bonding layer 201, the dicing process may be performed to form a chip structure 300.

It should be noted that FIG. 14 is a structural schematic corresponding to subsequent stages of an exemplary package structure on the basis of FIG. 11.

In one embodiment, the chip structure 300 may not include the improvement layer 220 which is not required to be removed subsequently, so the process may be performed in fewer steps, which may be advantageous for reducing the process complexity.

Figure 15:
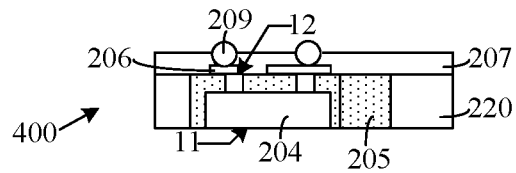
FIGS. 15-16 illustrate structural schematics corresponding to certain stages of another fabrication method of an exemplary package structure according to various disclosed embodiments of the present disclosure.
Figure 16:
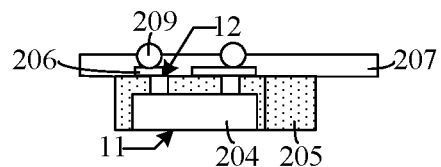

FIGS. 15-16 illustrate structural schematics corresponding to certain stages of another exemplary fabrication method of a package structure according to various disclosed embodiments of the present disclosure.

Referring to FIG. 15, after removing the substrate 200 and the bonding layer 201, the dicing process may be performed to form a chip structure 400.

It should be noted that FIG. 15 is a structural schematic corresponding to subsequent stages of an exemplary package structure on the basis of FIG. 11.

In one embodiment, the chip structure 400 may include a portion of the improvement layer 220.

Referring to FIG. 16, after performing the dicing process, the improvement layer 220 may be removed.

The improvement layer 220 may be removed by a process including one or a combination of a dry etching process and a wet etching process.

Correspondingly, referring to FIG. 5, the present disclosure may also provide a package structure. The structure may include:

the substrate 200, where the surface of the substrate 200 may have the bonding layer 201;

the improvement layer 220 on the bonding layer 201, where the improvement layer 220 may have openings 203 (shown in FIG. 4) and the bottoms of the openings 203 may expose the surface of the bonding layer 201; and the chips 204 in the openings 203, where the chips 204, each including the non-functional surface 11, may be attached to the bonding layer 201 at the bottoms of the openings 203.

The material of the bonding layer 201 may include the ultraviolet adhesive, the acrylic acid pressure sensitive adhesive or the epoxy resin pressure sensitive adhesive. The material of the improvement layer may include the photoresist.

Each chip 204 may include the functional surface 12 opposing to the non-functional surface 11. The functional surface 12 of the chip 204 may be equal to or lower than the top surface of the improvement layer 220; or the functional surface 12 of the chip 204 may be higher than the top surface of the improvement layer 220.

Compared with the conventional technology, the technical solution of the embodiments provided by the present disclosure has the following beneficial effects.

In the fabrication method of the package structure provided by the technical solution of the present disclosure, the improvement layer may have openings which may be used to accommodate the subsequent chips, and the improvement layer on the sidewalls of the openings may prevent the chips from being offset, so it is advantageous for improving the package structure performance.

Although the present disclosure has been disclosure above, the present disclosure is not limited thereto. Any change and modifications may be made by those skilled in the art without departing from the spirit and scope of the disclosure, and the scope of the disclosure should be determined by the scope defined by the claims.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A fabrication method of a package structure, comprising:

providing a bonding layer on a substrate;

forming an improvement layer on the bonding layer, wherein the improvement layer has openings, and bottoms of the openings expose a surface of the bonding layer;

providing chips, each including a non-functional surface; and mounting the chips by attaching the non-functional surfaces to the bonding layer at the bottoms of the openings, wherein a difference between a thermal expansion coefficient of the bonding layer and a thermal expansion coefficient of the improvement layer is within a preset range to prevent a relative displacement between the chips and the bonding layer.

2. The fabrication method according to claim 1, wherein:

each chip includes a functional surface opposing to the non-functional surface; and the functional surface of the chip is lower than or equal to a top surface of the improvement layer; or the functional surface of the chip is higher than a top surface of the improvement layer.

3. A fabrication method of a package structure, comprising:

providing a bonding layer on a substrate, wherein the bonding layer includes an ultraviolet adhesive, an acrylic acid pressure sensitive adhesive or an epoxy resin pressure sensitive adhesive;

forming an improvement layer on the bonding layer, wherein the improvement layer has openings, and bottoms of the openings expose a surface of the bonding layer;

providing chips, each including a non-functional surface; and mounting the chips by attaching the non-functional surfaces to the bonding layer at the bottoms of the openings.

4. The fabrication method according to claim 1, wherein forming the improvement layer and the openings includes:

forming an improvement film on the surface of the bonding layer; and exposing and developing the improvement film to form the improvement layer having the openings.

5. The fabrication method according to claim 4, wherein:

a material of the improvement film includes a photoresist.

6. A fabrication method of a package structure, comprising:

providing a bonding layer on a substrate;

forming an improvement layer on the bonding layer, wherein the improvement layer has openings, and bottoms of the openings expose a surface of the bonding layer;

providing chips, each including a non-functional surface and a functional surface opposing to the non-functional surface;

mounting the chips by attaching the non-functional surfaces to the bonding layer at the bottoms of the openings;

forming an encapsulation layer on the top surface of the improvement layer, sidewalls of the chips and the functional surfaces;

performing a thinning process on the encapsulation layer till the functional surfaces are exposed;

forming a distribution layer on the functional surfaces and a passivation layer on the distribution layer, wherein the passivation layer has solder openings exposing a top of the distribution layer;

forming solder balls in the solder openings;

after forming the solder balls, removing the bonding layer and the substrate to expose the non-functional surfaces of the chips and the improvement layer; and after removing the bonding layer and the substrate, performing a dicing process to form a plurality of chip structures.

7. The fabrication method according to claim 6, wherein:
the plurality of chip structures does not include the improvement layer; or
the plurality of chip structures includes a portion of the improvement layer.

8. The fabrication method according to claim 6, wherein, after removing the bonding layer and the substrate, and before performing the dicing process, further including:
removing the improvement layer.

9. The fabrication method according to claim 3, wherein:
each chip includes a functional surface opposing to the non-functional surface; and
the functional surface of the chip is lower than or equal to a top surface of the improvement layer; or the functional surface of the chip is higher than a top surface of the improvement layer.

10. The fabrication method according to claim 3, wherein forming the improvement layer and the openings includes:
forming an improvement film on the surface of the bonding layer; and
exposing and developing the improvement film to form the improvement layer having the openings.

11. The fabrication method according to claim 10, wherein:
a material of the improvement film includes a photoresist.

12. The fabrication method according to claim 9, after mounting the chips, further including:
forming an encapsulation layer on the top surface of the improvement layer, sidewalls of the chips and the functional surfaces;
performing a thinning process on the encapsulation layer till the functional surfaces are exposed;
forming a distribution layer on the functional surfaces and a passivation layer on the distribution layer, wherein the passivation layer has solder openings exposing a top of the distribution layer;
forming solder balls in the solder openings;
after forming the solder balls, removing the bonding layer and the substrate to expose the non-functional surfaces of the chips and the improvement layer; and
after removing the bonding layer and the substrate, performing a dicing process to form a plurality of chip structures.

13. The fabrication method according to claim 12, wherein:
the plurality of chip structures does not include the improvement layer; or
the plurality of chip structures includes a portion of the improvement layer.

14. The fabrication method according to claim 12, wherein, after removing the bonding layer and the substrate, and before performing the dicing process, further including:
removing the improvement layer.

15. The fabrication method according to claim 6, wherein:
the functional surface of the chip is lower than or equal to a top surface of the improvement layer; or the functional surface of the chip is higher than a top surface of the improvement layer.

16. The fabrication method according to claim 6, wherein:
the bonding layer includes an ultraviolet adhesive, an acrylic acid pressure sensitive adhesive or an epoxy resin pressure sensitive adhesive.

17. The fabrication method according to claim 6, wherein forming the improvement layer and the openings includes:
forming an improvement film on the surface of the bonding layer; and
exposing and developing the improvement film to form the improvement layer having the openings.

18. The fabrication method according to claim 17, wherein:
a material of the improvement film includes a photoresist.

19. The fabrication method according to claim 1, wherein:
the preset range is between −50 and 50.

* * * * *